United States Patent
Perry et al.

(10) Patent No.: US 8,121,569 B2
(45) Date of Patent: Feb. 21, 2012

(54) FREQUENCY GENERATION TECHNIQUES

(75) Inventors: Colin Leslie Perry, Swindon (GB);
Alan John Martin, Plympton (GB);
Richard Jeremy Salt, Swindon (GB)

(73) Assignee: Intel Corporation, Santa Clara, CA (US)

( * ) Notice: Subject to any disclaimer, the term of this patent is extended or adjusted under 35 U.S.C. 154(b) by 813 days.

(21) Appl. No.: 12/286,339

(22) Filed: Sep. 30, 2008

(65) Prior Publication Data

US 2010/0081405 A1 Apr. 1, 2010

(51) Int. Cl.
*H04B 1/18* (2006.01)
(52) U.S. Cl. ............... 455/192.1; 455/179.1; 455/314; 455/188.1; 455/76; 331/16; 331/94.1
(58) Field of Classification Search ........... 455/192.1, 455/179.1, 314, 188.1, 76; 331/16, 94.1
See application file for complete search history.

(56) References Cited

U.S. PATENT DOCUMENTS

| | | | | |
|---|---|---|---|---|
| 5,983,081 | A * | 11/1999 | Lehtinen | 455/76 |
| 7,139,545 | B2 * | 11/2006 | Drentea | 455/314 |
| 7,212,050 | B2 * | 5/2007 | Meltzer | 327/156 |
| 2002/0136342 | A1 | 9/2002 | Lee et al. | |
| 2003/0198311 | A1 | 10/2003 | Song et al. | |
| 2005/0068115 | A1 * | 3/2005 | Atsumi et al. | 331/94.1 |
| 2008/0164917 | A1 | 7/2008 | Floyd et al. | |

FOREIGN PATENT DOCUMENTS

| | | |
|---|---|---|
| EP | 1248395 B1 | 11/2007 |
| WO | 2010/039638 A2 | 4/2010 |
| WO | 2010/039638 A3 | 7/2010 |

OTHER PUBLICATIONS

International Preliminary Report on Patentability received for PCT Patent Application No. PCT/US2009/058559, mailed on Apr. 14, 2011, 5 pages.
Office Action received for European Patent Application No. 09818330.4, mailed on May 16, 2011, 2 pages.
International Search Report and Written Opinion for PCT Application No. PCT/US2009/058559, Mailed on Apr. 27, 2010, 10 pages.

* cited by examiner

*Primary Examiner* — Sanh Phu (57) ABSTRACT

Techniques involving the generation of signals at particular frequencies are disclosed. For instance, an apparatus may include an oscillator module, a synthesizer module, and a control module. The oscillator module produces an oscillator signal having a first frequency. From the oscillator signal, the synthesizer module produces an output signal having a second frequency. A frequency multiplier corresponds to the first and second frequencies. The control module selects the first frequency and the frequency multiplier such that a difference between the second frequency and a nearest integer multiple of the first frequency is greater than a predetermined threshold. As a result, reductions in spurious outputs may be achieved.

20 Claims, 6 Drawing Sheets

FREQUENCY GENERATION TECHNIQUES

BACKGROUND

Many devices, such as tuners, receivers, transmitters, upconverters, downconverters, and so forth, require the generation of oscillator signals having precise frequencies. Synthesizers (which typically include voltage controlled oscillators (VCOs)) produce output signals at desired frequencies. For instance, a fractional-N synthesizer generates an output signal having a frequency that is expressed as an integer number of a reference frequency plus a fractional amount of the reference frequency. The reference frequency is typically provided by a crystal oscillator. As such, fractional N synthesizers are often employed for their ability to produce a very fine frequency step, as well as the ability to achieve low phase noise performance.

However, in certain situations (such as when a VCO, a crystal oscillator reference, and other logic are implemented on a single die) unwanted interactions can cause spurs at an offset frequency from the desired frequency. This offset frequency is typically the difference between the VCO frequency and the nearest harmonic of the crystal oscillator reference frequency.

These spurs are not a problem with an integer-N synthesizer, as they would be aligned with the desired frequency. However, in a fractional-N synthesizer, the VCO frequency can be at a small offset from a harmonic of the crystal oscillator frequency.

Typically, the level of such spurs falls off at 6 dB per octave with increasing offset frequency. Thus, in a typical system, such spurs will be sufficiently attenuated once the offset exceeds a particular threshold (e.g., 50 kHz). However, if the required synthesized frequency is close to a harmonic of the crystal oscillator frequency, then spurs may present problems such as interference and degraded performance.

BRIEF DESCRIPTION OF THE DRAWINGS

In the drawings, like reference numbers generally indicate identical, functionally similar, and/or structurally similar elements. The drawing in which an element first appears is indicated by the leftmost digit(s) in the reference number. The present invention will be described with reference to the accompanying drawings, wherein.

DETAILED DESCRIPTION

Embodiments provide techniques for the generation of signals at particular frequencies. For instance, embodiments provide for the reduction of unwanted spurious outputs in synthesizers. This may be achieved through a priori knowledge of which combinations of frequency multiplier values and first frequency values (e.g., crystal oscillator frequencies) achieve desired output frequencies having reduced spurious outputs. Thus, embodiments may advantageously allow for less complex synthesizer implementations that achieve superior performance (e.g., reduced spurious outputs).

As an example, an apparatus may include an oscillator module, a synthesizer module, and a control module. The oscillator module produces an oscillator signal having a first frequency. From the oscillator signal, the synthesizer module produces an output signal having a second frequency. A frequency multiplier corresponds to the first and second frequencies. The control module selects the first frequency and the frequency multiplier such that a difference between the second frequency and a nearest integer multiple of the first frequency is greater than a predetermined threshold. Embodiments, however, are not limited to this exemplary apparatus.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
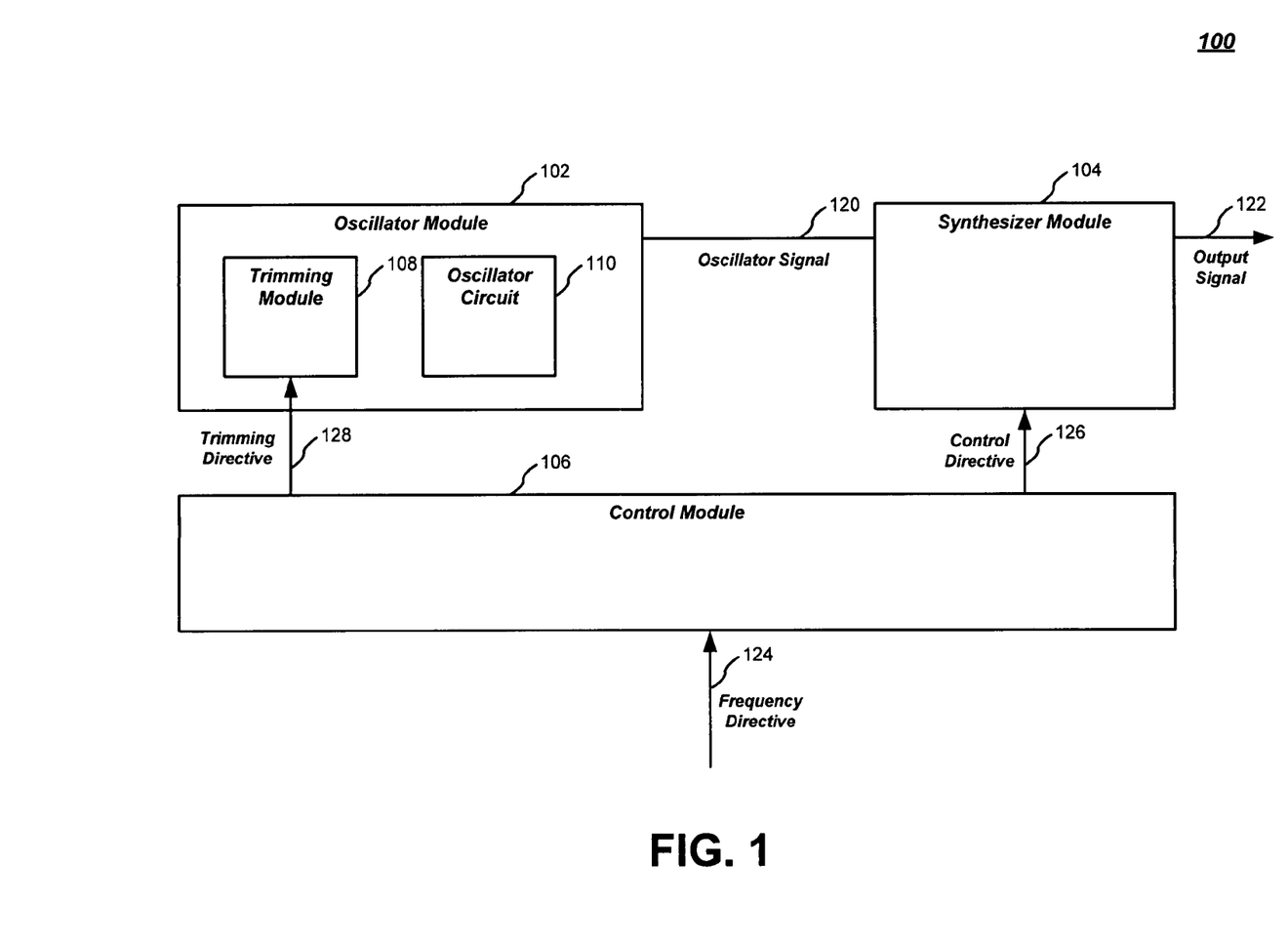
FIG. 1 is a diagram of an exemplary apparatus.

FIG. 1 is a diagram of an apparatus 100 in which various frequency generation techniques may be employed. As shown in FIG. 1, apparatus 100 includes an oscillator module 102, a synthesizer module 104, and a control module 106. These elements may be implemented in hardware, software, or any combination thereof.

FIG. 1 shows that oscillator module 102 includes a trimming module 108 and an oscillator circuit 110. Oscillator circuit 110 generates an oscillator signal 120. In embodiments, oscillator signal 120 has a frequency that is based on characteristics of oscillator circuit 110, as well as on settings of trimming module 108. FIG. 1 shows that these settings are received from control module 106 in the form of a trimming directive 128. Further details regarding an implementation of oscillator module 102 are provided below with reference to FIG. 2.

As shown in FIG. 1, oscillator signal 120 is sent to synthesizer module 104. In turn, synthesizer module 104 generates an output signal 122 at a desired frequency. This desired frequency (also referred to as the output frequency) is determined by the frequency of oscillator signal 120 (also referred to as the reference frequency) and a control directive 126 that synthesizer module 104 receives from control module 106.

In embodiments, the frequency of oscillator signal 120 may be in the 1 MHz to 40 MHz range. Also, the frequency of output signal 122 may be in the 2 GHz to 8 GHz range. Embodiments, however, are not limited to these frequency ranges.

Synthesizer module 104 may provide fractional-N synthesis features. Such features provide for the frequency of output signal 122 to be an integer multiple of the reference frequency plus a fractional amount of the reference frequency. This relationship is expressed below in Equation (1).

$$f_2 = \left(N + \frac{k}{M}\right) \times f_1 \qquad (1)$$

In Equation (1), $f_1$ represents the reference frequency and $f_2$ represents the output frequency. N, k, and M are integers. More particularly, N represents a integer multiple of $f_1$, while $k/M$ represents a fractional amount of $f_1$. Further, M represents the amount of fractionality that is offered by synthesizer module 104.

FIG. 1 shows that control module 106 receives a frequency directive 124, which specifies the desired frequency of output signal 122. Based on this directive, control module 106 generates control directive 126 (which is sent to synthesizer module 104), and trimming directive 128 (which is sent to trimming module 108 within oscillator module 102).

Control directive 126 provides synthesizer module 104 with a ratio (e.g., a non-integer, fractional-N ratio). In embodiments, control directive 126 may be implemented as a digital word comprising multiple bits. However, other implementations may be employed.

Trimming directive 128 "trims" or causes the tuning of oscillator circuit 110 to be modified. For instance, trimming directive 128 may comprise multiple control signals. Each of these control signal(s) may couple one or more elements (e.g., one or more capacitors) into oscillator circuit 110. This coupling may be provided through switching elements, such as transistors. However, other switching elements, (e.g., mechanical and/or electronic) may alternatively be employed. Alternatively or additionally, trimming directive 128 may adjust a variable reactance or reactive load within trimming module 108 to tune oscillator circuit 110.

In general operation, control module 106 receives frequency directive 124. Based on this directive, control module 106 generates control directive 126 and trimming directive 128. For instance, control module 106 may select directives 126 and 128 such that a difference between the output frequency (i.e., the frequency of output signal 122) and a nearest integer multiple of the reference frequency (i.e., the frequency of oscillator signal 120) is greater than a predetermined threshold. Thus, embodiments may advantageously control the offset of spurs from the output frequency.

An example is now provided involving a reference frequency of 20 MHz and a desired output signal frequency of 799.99 MHz. This arrangement entails a frequency multiplier of 39.9995. Moreover, with this arrangement, the desired frequency is offset from the $40^{th}$ harmonic of the reference frequency by 10 kHz. By trimming the reference frequency by 1.5 kHz to 19.9985 MHz, its 40th harmonic becomes 799.94 MHz. This is offset from the desired frequency by 50 kHz. This larger offset provides a lower spur level, which may be more desirable. By trimming the reference frequency by 1.5 kHz, (75 ppm), the frequency multiplier now becomes 40.00250019 to achieve the desired output signal frequency.

Figure 2:
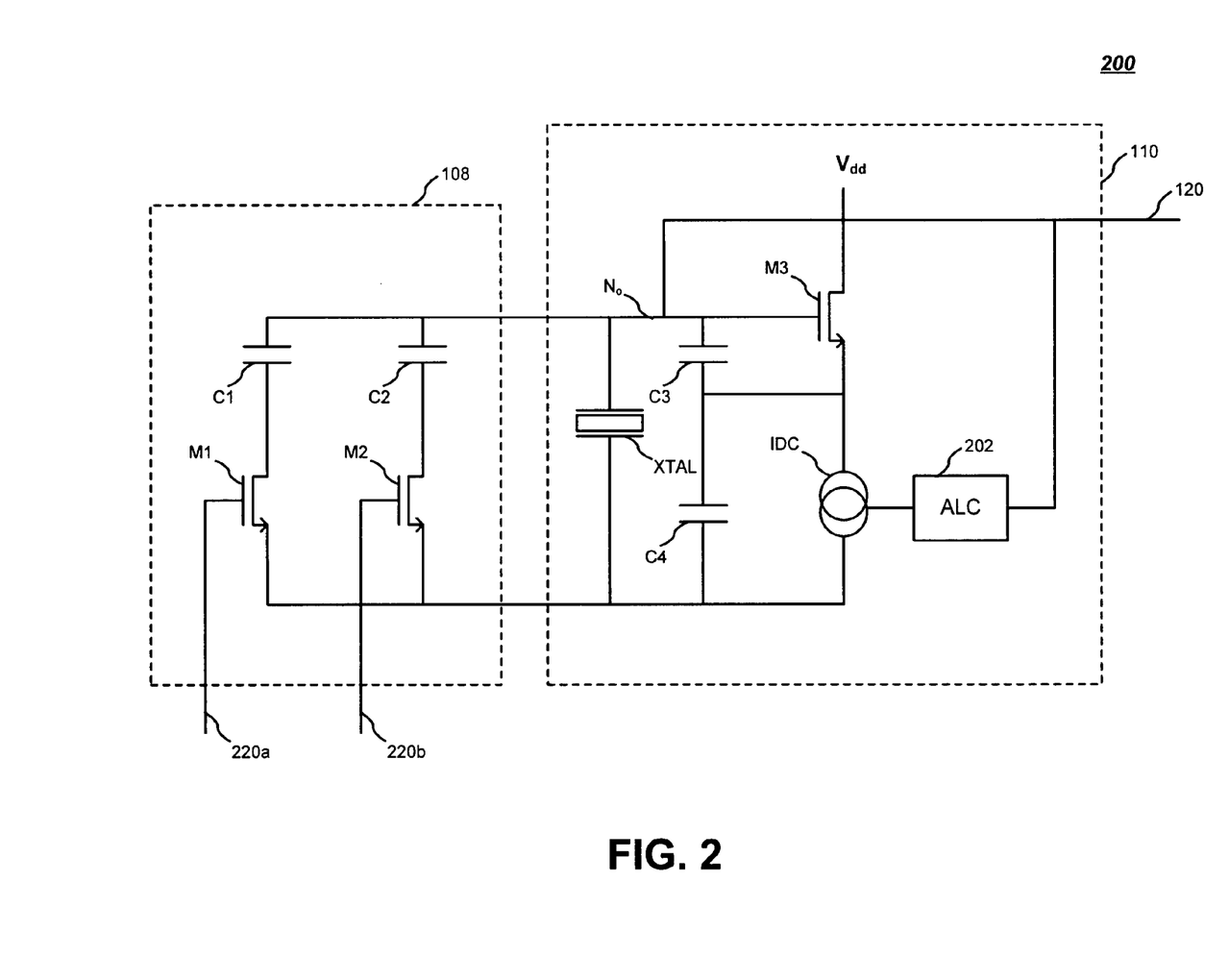
FIG. 2 is a diagram of exemplary oscillator module implementation.

FIG. 2 is a diagram showing an exemplary implementation 200 of oscillator module 102. This implementation is shown for purposes of illustration, and not limitation. Thus, embodiments may employ other implementations. In FIG. 2, oscillator circuit 110 of oscillator module 102 is implemented as a Colpitts crystal oscillator. In particular, FIG. 2 shows oscillator circuit 110 including a crystal (XTAL), a capacitor C3, a capacitor C4, a transistor M3, and a direct current source (IDC). M3 is coupled to a node providing an operational voltage $V_{dd}$. As shown in FIG. 2, an output node $N_o$ produces output signal 120. This implementation is shown for purposes of illustration, and not limitation. For instance, instead of employing XTAL, other elements (such as a ceramic resonator, or a micro machined (MEM) element), may be employed.

Trimming module 108 may include one or more reactive elements. For example, FIG. 2 shows that trimming module 108 may include multiple pairings of capacitors and transistors, where each pairing is in parallel with the crystal (XTAL) of oscillator circuit 110. For instance, FIG. 2 shows a capacitor C1 in series with a transistor M1, as well as a capacitor C2 in series with a transistor M2. Although two pairings are shown, any number of pairings may be employed.

Control signals 220a and 220b (which may be received from control module 106 in FIG. 1) selectively turn on transistors M1 and M2, respectively. As a result, capacitors C1 and/or C2 may each be selectively introduced in parallel to the crystal (XTAL) of oscillator circuit 110. Such introductions change the resonance of oscillator circuit 110. In turn, this changes (lowers or trims) the frequency of oscillator signal 120. Thus, with reference to FIG. 1, control signals 220a and 220b may be included in trimming directive 128.

Alternatively or additionally, trimming module 108 may include one or more elements having variable reactances. Examples of such elements include varactors, variable inductors, and so forth. To adjust the resonance of oscillator circuit 110, such variable reactances may be selectively introduced in parallel to XTAL and/or adjusted based on control signal(s) that may be included in trimming directive 128.

In embodiments, trimming may effectively de-Q oscillator circuit 110. However, compensation for this effect can be achieved through an automatic level circuit (ALC) to maintain optimum amplitude. For example, FIG. 2 shows oscillator circuit 110 including an ALC 202 to maintain the amplitude of oscillator circuit 120. As shown in FIG. 2, ALC 202 provides feedback from oscillator signal 120 to current source IDC.

Although implementation 200 employs transistors to couple capacitors C1 and/or C2 to XTAL of oscillator circuit 110, other switching elements (e.g., electronic and/or mechanical switching elements) may be employed.

Figure 3:
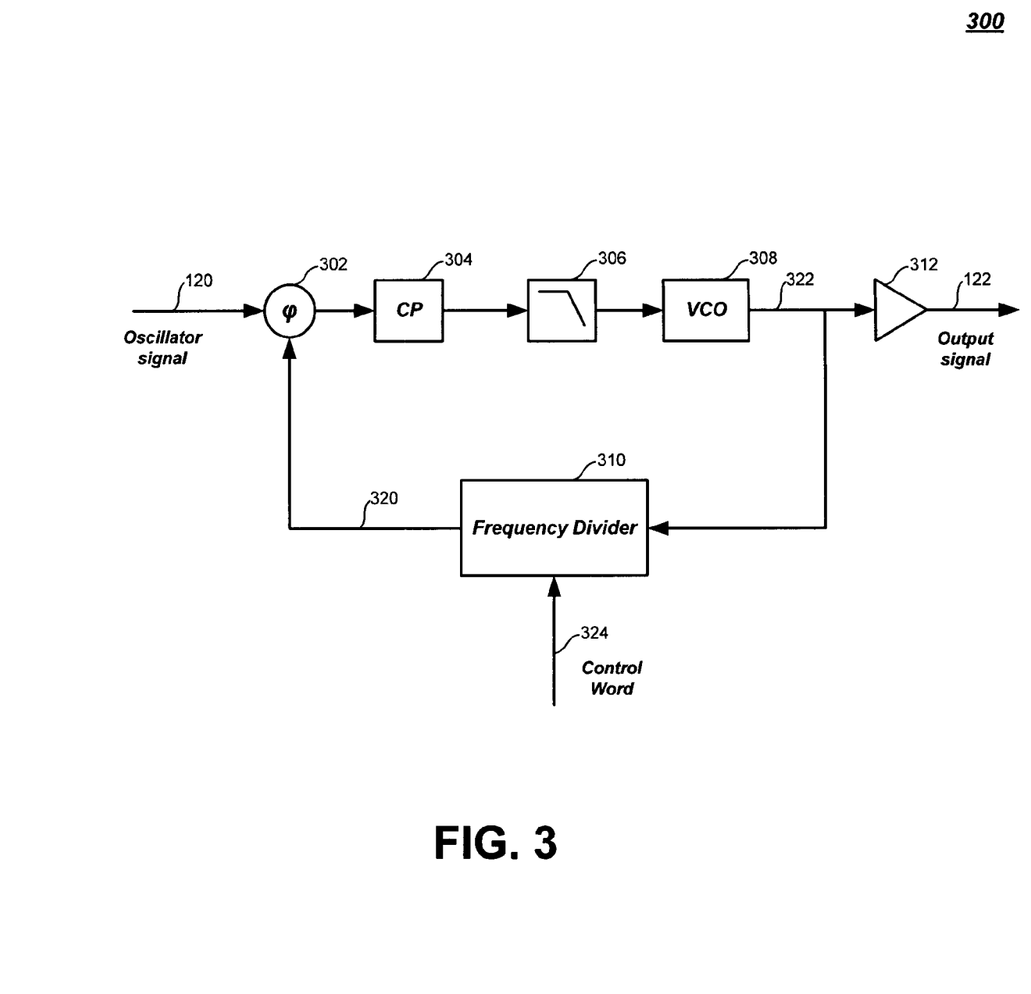
FIG. 3 is a diagram of a an exemplary synthesizer module implementation.

As described above, synthesizer module 104 converts oscillator signal 120 (at a reference frequency) to output signal 122 (at an output frequency). FIG. 3 is a diagram showing an exemplary implementation 300 of synthesizer module 104. This implementation is shown for purposes of illustration, and not limitation. Thus, embodiments may employ other implementations.

Implementation 300 is arranged as a phase-locked loop (PLL). As shown in FIG. 3, implementation 300 includes a phase-frequency detector 302, a charge pump 304, a low pass filter 306, a voltage controlled oscillator (VCO) 308, and a frequency divider 310. These elements may be implemented in hardware, software, or any combination thereof.

Phase-frequency detector 302 detects a frequency difference between oscillator signal 120 and a feedback signal 320. Based on this detection, phase-frequency detector 302 produces a signal representing the frequency difference. This signal is sent to charge pump 304. In turn, charge pump 304 produces a corresponding signal, which is sent to low pass filter 306. From this signal, low pass filter 306 outputs a filtered signal that is sent to a voltage controlled oscillator (VCO). As a result, VCO 308 produces a signal 322 at a desired output frequency. More particularly, applying the filtered signal to VCO 308 will cause the PLL to "lock". Through this locking, the average frequency of signal 320 will match that of reference signal 120, with constant average phase offset.

As shown in FIG. 3, signal 352 may be amplified by an output amplifier 312 to produce output signal 122. In addition, signal 322 is sent to frequency divider 310.

Frequency divider 310 divides the frequency of signal 322. This frequency division produces feedback signal 320, which is sent to phase-frequency detector 302. The divisor employed in this division is provided to frequency divider 310 as a control word 324. In the context of FIG. 1, control word 324 corresponds to control directive 126.

In embodiments, frequency divider 310 may perform fractional-N frequency division in a manner specified by control word 324. As described above, fractional-N frequency division divides the frequency of signal 322 by a value that is comprised an integer and fractional amount such that frequency of signal 322 is an integer multiple of the frequency of feedback signal 320 plus a fractional amount of the frequency of feedback signal 320. Accordingly, frequency divider 310 may be implemented with sigma-delta techniques to provide such fractional-N division features. The embodiments, however, are not limited to such techniques.

Figure 4:
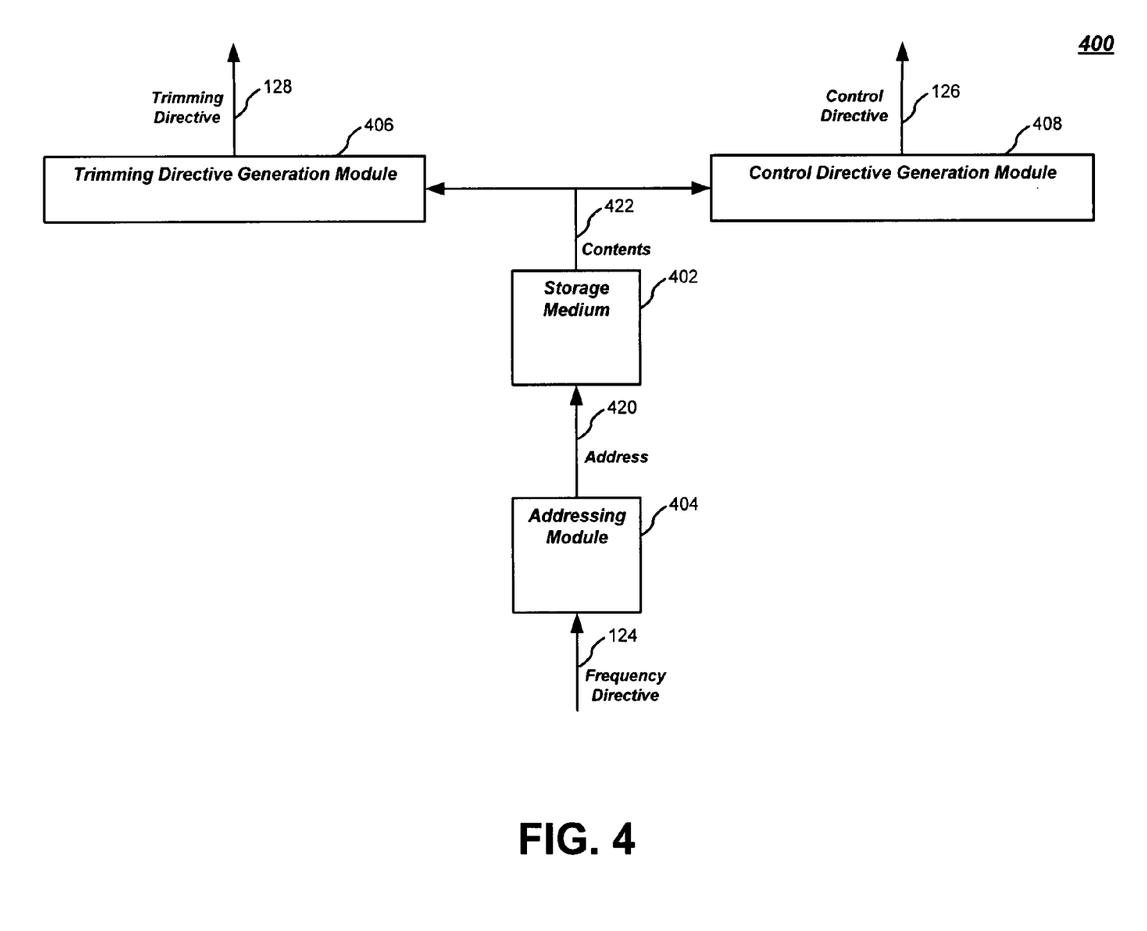
FIG. 4 is a diagram of an exemplary control module.

FIG. 4 is a diagram showing an exemplary implementation 400 of control module 106. This implementation is shown for purposes of illustration, and not limitation. Thus, embodiments may employ other implementations. As shown in FIG. 4, implementation 400 includes a storage medium 402, an addressing module 404, a trimming directive generation module 406, and a control directive generation module 408. These elements may be implemented in hardware, software, or any combination thereof.

Storage medium 402 (e.g., memory) provides a lookup table (LUT). This lookup table stores values of control directive 126 and trimming directive 128 for values of frequency directive 124. Storage medium 402 may be implemented in various ways. For example, storage medium 402 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. Embodiments, however, are not limited to these examples.

As shown in FIG. 4, addressing module 404 receives frequency directive 124. From this, addressing module 404 generates an address 420 corresponding to the value of frequency directive 124. With this address, contents 422 of storage medium 402 are accessed.

These accessed contents provide values of control directive 126 and trimming directive 128. These values will achieve a frequency for output signal 122 (with reference to FIG. 1) that is specified by frequency directive 124. Moreover, in embodiments, the values of control directive 126 and trimming directive 128 will be such that a difference between the output frequency (i.e., the frequency of output signal 122 with reference to FIG. 1) and a nearest integer multiple of the reference frequency (i.e., the frequency of oscillator signal 120 with reference to FIG. 1) is greater than a predetermined threshold.

FIG. 4 shows that contents 422 are sent to trimming directive generation module 406, and control directive generation module 408. From this, trimming directive generation module 406, and control directive generation module 408 generate trimming directive 128 and control directive 126, respectively. This may involve, for example, generating distinct signals (e.g., signals 220a-b with reference to FIG. 2 and/or control word 324 with reference to FIG. 3) from numerical values represented by contents 422.

Figure 5:
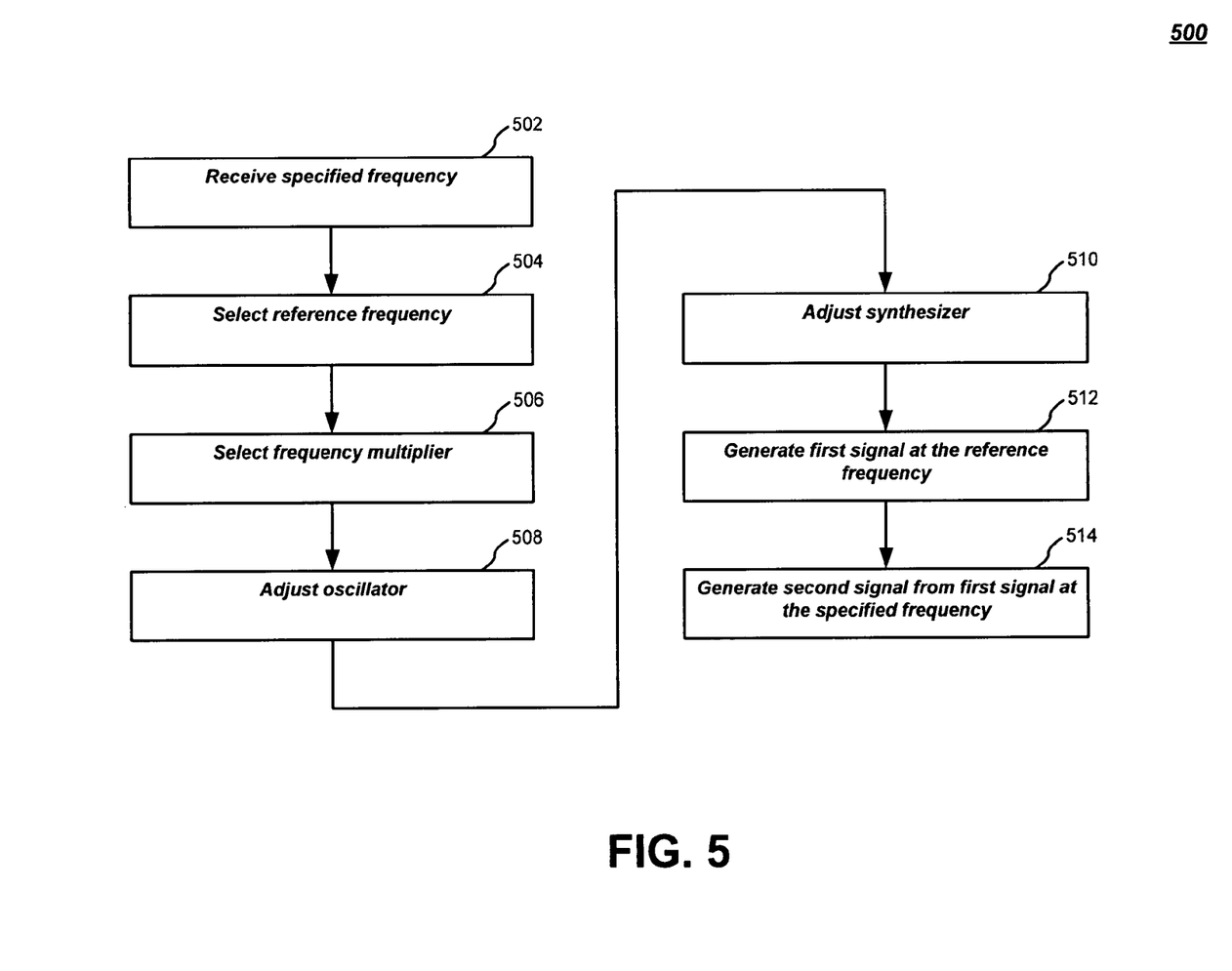
FIG. 5 is a diagram of an exemplary logic flow.

FIG. 5 is a diagram showing an exemplary logic flow 500. Although this flow is described in the context of FIG. 1, it may be employed in other contexts. The flow of FIG. 5 includes a block 502, at which a specified output frequency (e.g., a frequency for output signal 122 of FIG. 1) is received. Thus, in the context of FIG. 1, this may involve control module 106 receiving frequency directive 124.

Based on the specified output frequency, blocks 504 and 506 are performed. In particular, a reference frequency is selected at block 504, and a frequency multiplier is selected at a block 506. With reference to FIG. 1, selecting the reference frequency may involve trimming oscillator circuit 110 through the generation of trimming directive 128. Also, with reference to FIG. 1 selecting the frequency multiplier may involve generating control directive 126.

Based on these selections, blocks 508 and 510 are performed. For instance, at block 508, an oscillator is adjusted. With reference to FIG. 1, this may involve trimming oscillator circuit 110. For example, one or more capacitances may be coupled to a crystal oscillator.

At block 510, a synthesizer is adjusted. In the context of FIG. 1, this may involve sending control directive 126 to synthesizer module. Also, this may involve adjusting a PLL. For instance, a frequency divider in the feedback portion of a PLL may be set in accordance with the frequency multiplier selected at block 508.

At a block 512, a first signal at the reference frequency (e.g., oscillator signal 120) is generated. Also, at a block 514, a second signal (e.g., output signal 122) is generated from the first signal. The second signal is at the specified frequency. Moreover, the specified frequency is substantially equal to the frequency multiplier times the reference frequency.

As described herein, a reference frequency is selected at block 504, and a frequency multiplier is selected at a block 506. The frequency multiplier may be a fractional-N multiplier in accordance with Equation (1), above. Accordingly, the multiplier has an integer portion (N) and a fractional portion (k/M). Selecting the frequency multiplier at block 506 may involve selecting it such that its non-integer (fractional) portion is greater than a predetermined threshold.

Figure 6:
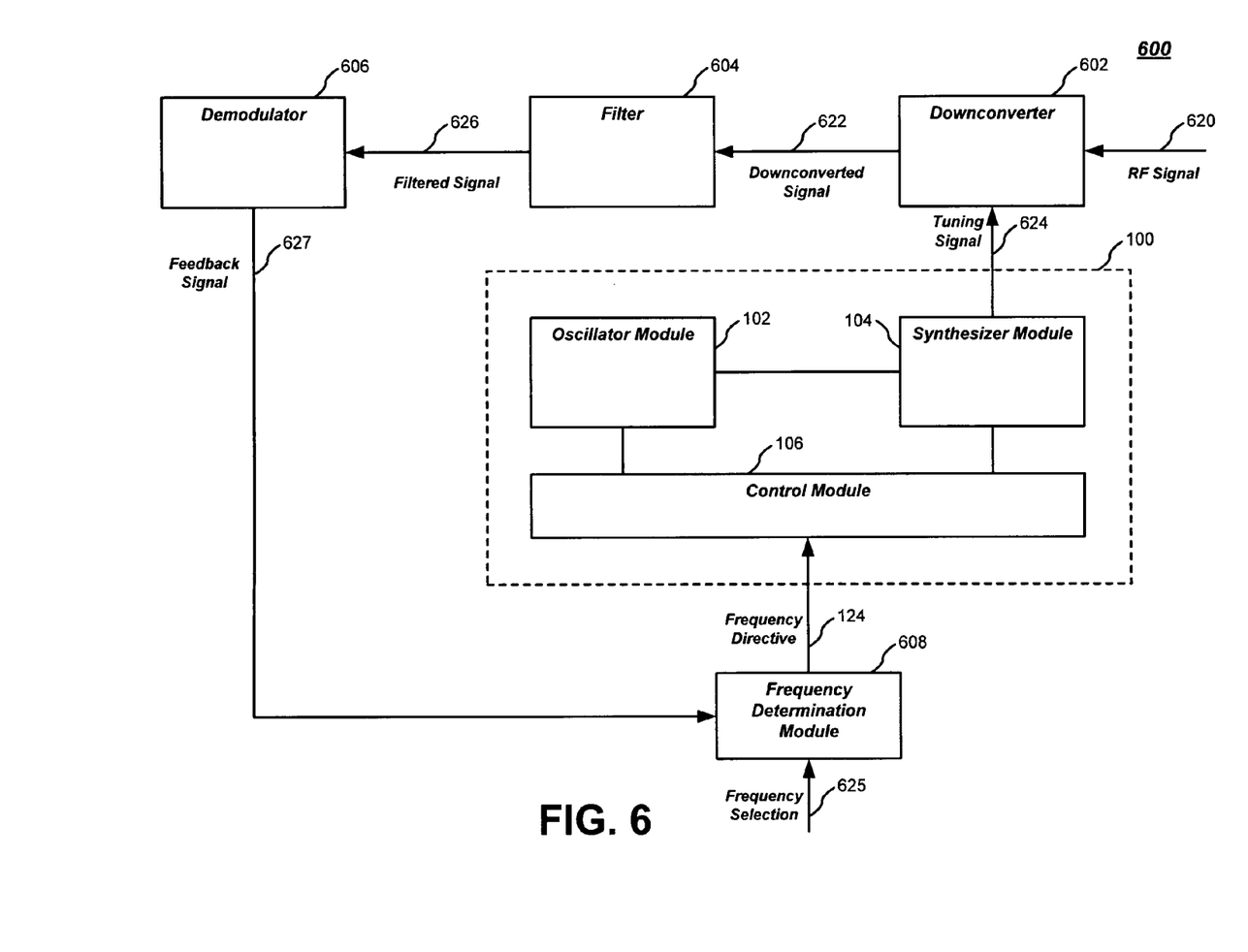
FIG. 6 is a diagram of an exemplary system.

FIG. 6 is a diagram of an exemplary system 600, which includes a downconverter 602, a filter 604, a demodulator 606, and a frequency determination module 608. Also, system 600 includes apparatus 100 of FIG. 1 (also referred to herein as a tuning module). These elements may be implemented in hardware, software, or any combination thereof.

As shown in FIG. 6, downconverter 602 receives a radio frequency (RF) signal 620. RF signal 620 may be received from a wired or wireless communications medium. From this signal, downconverter 602 generates a downconverted signal 622, which is at a lower frequency range. The amount of downconversion (or frequency translation) performed by downconverter 602 is based on a tuning signal 624.

As shown in FIG. 6, downconverter 602 receives tuning signal 624 from apparatus 100 (the tuning module). Accordingly, tuning signal 624 has a frequency that is generated from frequency directive 124 in accordance with the techniques described above. Thus, with reference to FIG. 1, tuning signal 624 corresponds to output signal 122.

Filter 604 receives downconverted signal 622 and produces a filtered signal 626, which is sent to demodulator 606. In embodiments filter 604 is a bandpass filter. However, other filter types (e.g., low pass filters) may be employed. Filter 604 has a pass band. Thus, signal energy that is outside of this pass band is rejected.

Therefore, it is desirable for downconverter 602 to be accurately tuned for its pass band. The techniques described herein provide accurate frequency synthesis with reduced spurious outputs. Such reductions in spurious outputs advantageously allow downconverter 602 to accurately downconvert RF signal 620.

Demodulator 606 converts filtered signal 626 into an information sequence (e.g., a digital symbol stream). This conversion may be in accordance with one or more demodulation techniques.

As shown in FIG. 6, frequency determination module 608 generates frequency directive 124. This generation may be based on a frequency selection 625, as well as on a feedback signal 627 received from demodulator 606. Frequency selection 625 may be a tuning signal (or tuning information) received from a user. Feedback signal 627 may provide an adjustment to tuning selection 625.

This adjustment may be based on automatic frequency control (AFC) features provided by demodulator 606. In particular, demodulator 606 may detect frequency errors in filtered signal 626. Such errors may arise from various sources. One such source may be reference frequency errors caused by crystal tolerance within oscillator module 102. Another such source may be RF input frequency shifts (e.g., due to the Doppler effect).

Upon detection of such errors, demodulator 606 may generate feedback signal 627 to compensate for frequency selection 625. As a result frequency directive 124 is based on frequency selection 625 and feedback signal 627.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software.

The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

While various embodiments of the present invention have been described above, it should be understood that they have been presented by way of example only, and not in limitation.

Accordingly, it will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. An apparatus, comprising:
   an oscillator module to produce an oscillator signal, the oscillator signal having a first frequency;
   a synthesizer module to produce an output signal from the oscillator signal, the output signal having a second frequency, wherein a frequency multiplier corresponds to the first and second frequencies; and
   a control module to select the first frequency and to select the frequency multiplier such that a difference between the second frequency and a nearest integer multiple of the first frequency is greater than a predetermined threshold.

2. The apparatus of claim 1, wherein the control module is to receive an indication of the second frequency.

3. The apparatus of claim 1, wherein the control module is to determine a trimming setting, the trimming setting to establish the first frequency.

4. The apparatus of claim 3, further comprising a storage medium to store a plurality of trimming settings, each of the trimming settings corresponding to a second frequency value.

5. The apparatus of claim 1, wherein the frequency multiplier is a fractional-N multiplier.

6. The apparatus of claim 1:
   wherein the oscillator module includes an oscillator circuit and one or more reactive elements; and
   wherein the control module is to selectively couple one or more of the reactive elements to the oscillator circuit based on the selected first frequency.

7. The apparatus of claim 6, wherein the one or more reactive elements includes a reactive element having a variable reactance.

8. The apparatus of claim 1, wherein the oscillator module includes at least one of a crystal oscillator circuit, a ceramic resonator, or a micro machined (MEM) element.

9. The apparatus of claim 1, wherein the synthesizer module includes a phase-locked loop (PLL).

10. The apparatus of claim 1, wherein the control module is to adjust the PLL in accordance with the frequency multiplier.

11. A method, comprising:
    based on a specified frequency, selecting a reference frequency and a frequency multiplier;
    generating a first signal at the reference frequency; and
    generating a second signal from the first signal, the second signal at the specified frequency, wherein the specified frequency is equal to the frequency multiplier times the reference frequency;
    wherein selecting the frequency multiplier comprises selecting the frequency multiplier to have a non-integer portion that is greater than a predetermined threshold.

12. The method of claim 11, wherein selecting the reference frequency comprises determining a trimming setting for an oscillator.

13. The method of claim 12, further comprising adjusting the oscillator in accordance with the trimming setting.

14. The method of claim 11, further comprising adjusting a synthesizer in accordance with the frequency multiplier.

15. The method of claim 14:
wherein the synthesizer includes a phase-locked loop (PLL) comprising a frequency divider; and
wherein said adjusting the oscillator comprises adjusting a frequency divider of aphase-locked loop.

16. The method of claim 11, further comprising:
receiving the specified frequency.

17. A system, comprising:
a downconverter to downconvert an RF signal based on a tuning signal; and
a tuning module to provide the tuning signal;
wherein the tuning module comprises:
- an oscillator module to produce an oscillator signal, the oscillator signal having a first frequency;
- a synthesizer module to produce the tuning signal from the oscillator signal, the tuning signal having a second frequency, wherein a frequency multiplier corresponds to the first and second frequencies; and
- a control module to select the first frequency and to select the frequency multiplier such that a difference between the second frequency and a nearest integer multiple of the first frequency is greater than a predetermined threshold.

18. The system of claim 17, wherein the tuning module is to receive an indication of the second frequency.

19. The system of claim 17:
wherein the oscillator module includes an oscillator circuit and one or more trimming capacitors; and
wherein the control module is to selectively couple one or more of the trimming capacitors to the oscillator circuit based on the selected first frequency.

20. The system of claim 17:
wherein the synthesizer module includes a phase-locked loop (PLL);
and wherein the control module is to adjust the PLL in accordance with the frequency multiplier.

\* \* \* \* \*